US011817295B2

(12) United States Patent
Ventzek et al.

(10) Patent No.: US 11,817,295 B2
(45) Date of Patent: Nov. 14, 2023

(54) THREE-PHASE PULSING SYSTEMS AND METHODS FOR PLASMA PROCESSING

(71) Applicant: Tokyo Electron Limited, Tokyo (JP)

(72) Inventors: Peter Ventzek, Austin, TX (US); Alok Ranjan, Austin, TX (US); Mitsunori Ohata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 768 days.

(21) Appl. No.: 16/540,160

(22) Filed: Aug. 14, 2019

(65) Prior Publication Data

US 2021/0050183 A1 Feb. 18, 2021

(51) Int. Cl.
*H01J 37/32* (2006.01)
(52) U.S. Cl.
CPC ...... *H01J 37/32146* (2013.01); *H01J 37/321* (2013.01); *H01J 2237/332* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 9,872,373 B1* | 1/2018 | Shimizu | H01J 37/32146 |
| 2011/0309049 A1 | 12/2011 | Papasouliotis et al. | |
| 2016/0126069 A1 | 5/2016 | Kwon et al. | |
| 2017/0040176 A1 | 2/2017 | Long et al. | |
| 2017/0099722 A1 | 4/2017 | Kawasaki et al. | |

FOREIGN PATENT DOCUMENTS

| | | |
|---|---|---|
| KR | 101677748 B1 | 11/2016 |
| WO | 2019070737 A1 | 4/2019 |

OTHER PUBLICATIONS

Kiehlbauch, Mark W., and David B. Graves. "Effect of Neutral Transport on the Etch Product Lifecycle during Plasma Etching of Silicon in Chlorine Gas." Journal of Vacuum Science & Technology A: Vacuum, Surfaces, and Films, vol. 21, No. 1, 2003, pp. 116-126., doi:10.1116/1.1527952.

Stafford, L., et al. "Influence of Redeposition on the Plasma Etching Dynamics." Journal of Applied Physics, vol. 101, No. 8, 2007, p. 083303., doi:10.1063/1.2719015.

* cited by examiner

*Primary Examiner* — David P Turocy
(74) *Attorney, Agent, or Firm* — Slater Matsil, LLP

(57) ABSTRACT

A method of plasma processing includes performing a reactive species control phase, performing an ion/radical control phase, and performing a by-product control phase. The reactive species control phase includes pulsing source power to a processing chamber to generate ions and radicals in a plasma. The ion/radical control phase is performed after the reactive species control phase. The ion/radical control phase includes reducing the source power to the processing chamber and pulsing bias power to a substrate in the processing chamber. The by-product control phase is performed after the ion/radical control phase. The by-product control phase includes reducing the source power to the processing chamber relative to the reactive species control phase and reducing the bias power to the substrate relative to the ion/radical control phase.

17 Claims, 8 Drawing Sheets

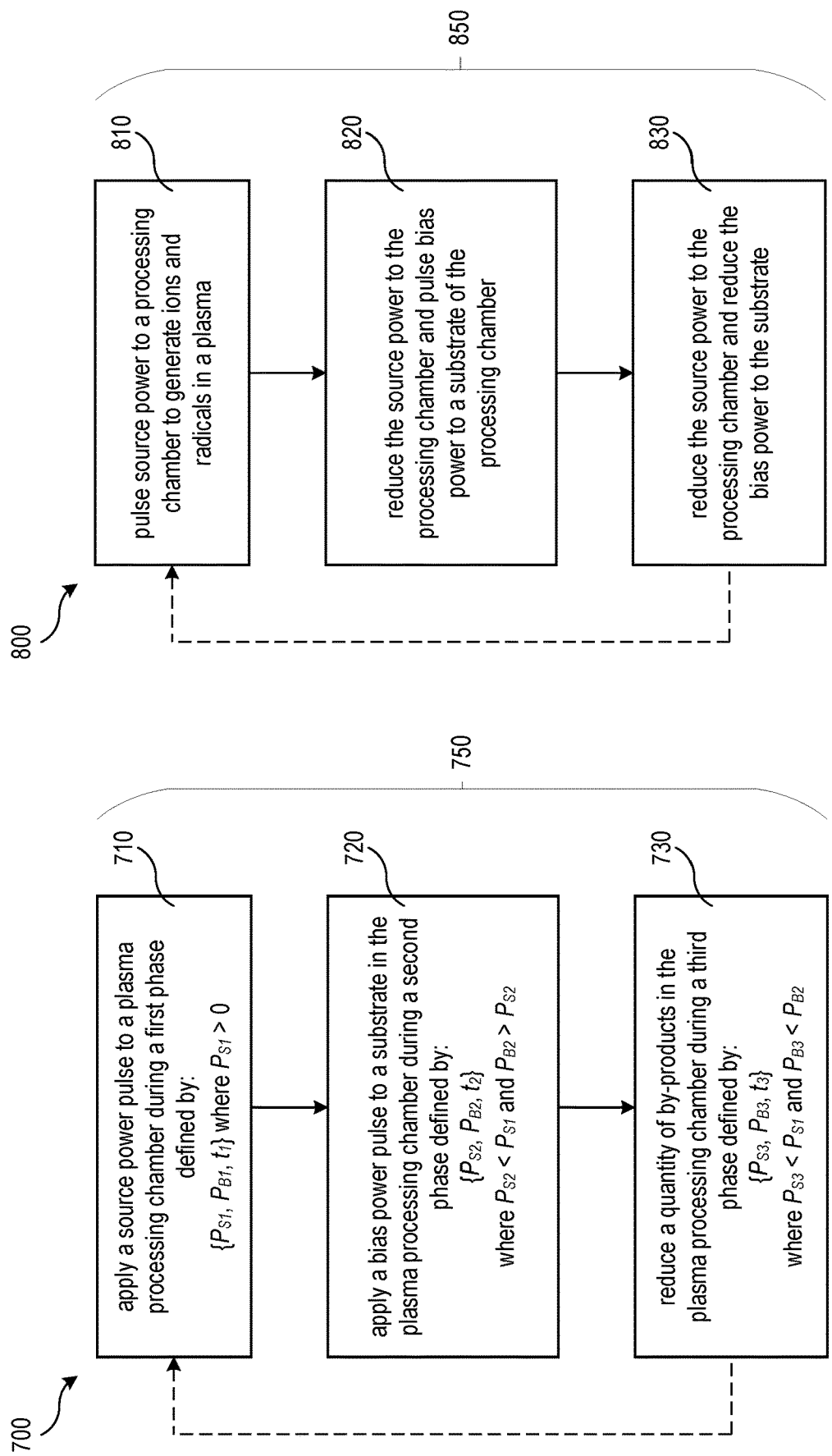

THREE-PHASE PULSING SYSTEMS AND METHODS FOR PLASMA PROCESSING

TECHNICAL FIELD

The present invention relates generally to plasma processing, and, in particular embodiments, to systems and methods for plasma processing using three-phase pulsing.

BACKGROUND

Device formation within microelectronic workpieces may involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes.

Plasma processes are commonly used to form devices in microelectronic workpieces. For example, plasma etching and plasma deposition are common process steps during semiconductor device fabrication. A combination of source power and bias power may be used to generate and direct plasma during plasma processing. By-products may be generated during etching and deposition phases. The presence of by-products may be beneficial or detrimental depending on the density of by-products at the substrate and in the plasma system.

SUMMARY

In accordance with an embodiment of the invention, a method of plasma processing includes performing a reactive species control phase, performing an ion/radical control phase, and performing a by-product control phase. The reactive species control phase includes pulsing source power to a processing chamber to generate ions and radicals in a plasma. The ion/radical control phase is performed after the reactive species control phase. The ion/radical control phase includes reducing the source power to the processing chamber and pulsing bias power to a substrate in the processing chamber. The by-product control phase is performed after the ion/radical control phase. The by-product control phase includes reducing the source power to the processing chamber relative to the reactive species control phase and reducing the bias power to the substrate relative to the ion/radical control phase.

In accordance with another embodiment, a method of plasma processing includes processing a substrate using a cycle of power pulses during which source power pulses are applied to a coupling element and bias power pulses are applied to a substrate holder supporting a substrate. The cycle of power pulses includes a first phase, a second phase, and a third phase. The first phase includes a first source power level and a first bias power level. The first bias power level is greater than zero. The second phase includes a second source power level and a second bias power level. The second source power level is less than the first source power level. The second bias power level is greater than the second source power level. The third phase includes a third source power level and a third bias power level. The third source power level is less than the first source power level. The third bias power level is less than the second bias power level.

In accordance with still another embodiment of the invention, a method of plasma processing includes applying a source power pulse to a plasma processing chamber during a first phase. The first phase includes a first source power level greater than zero. The first phase further includes a first bias power level. The method also includes applying a bias power pulse to a substrate in the plasma processing chamber during a second phase after the first phase. The second phase includes a second source power level less than the first source power level and a second bias power level greater than the second source power level. The method further includes reducing a quantity of by-products in the plasma processing chamber during a third phase after the second phase. The third phase includes a third source power level less than the first source power level and a third bias power level less than the second bias power level.

BRIEF DESCRIPTION OF THE DRAWINGS

For a more complete understanding of the present invention, and the advantages thereof, reference is now made to the following descriptions taken in conjunction with the accompanying drawings, in which:

FIG. 6A illustrates the inductively coupled plasma processing apparatus during a reactive species control phase, FIG. 6B illustrates the inductively coupled plasma processing apparatus during an ion/radical control phase, and FIG. 6C illustrates the inductively coupled plasma processing apparatus during a by-product control phase;

FIG. 7 illustrates an example method of plasma processing in accordance with an embodiment of the invention; and FIG. 8 illustrates another example method of plasma processing in accordance with an embodiment of the invention.

Figure 1:
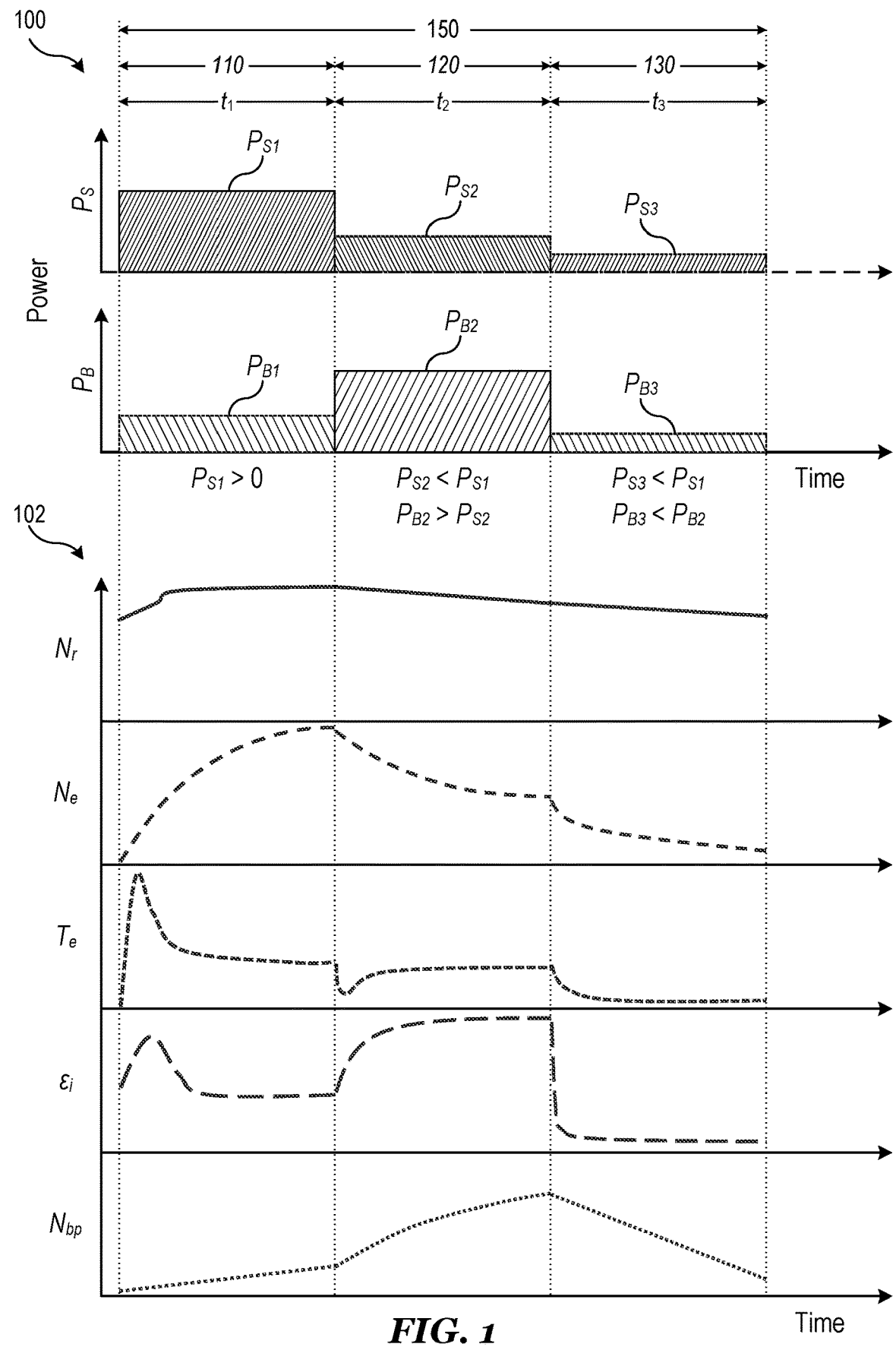
FIG. 1 illustrates a schematic timing diagram of an example plasma processing method and a corresponding qualitative graph in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Control of plasma processing characteristics may be important when implementing plasma processing techniques (e.g. pulsing processing techniques). For example, reactive species generation, the ratio of ions to radicals, ion energy (and ion angle), by-products, and the ratios of ions and radicals to by-products, as well as others may affect precision and feature accuracy during a given plasma process. It is therefore desirable to be able to independently control various plasma processing characteristics. For example, enhanced control of reactive species, radicals, and by-products may be useful for the formation of contacts, fins, gate lines, other front-end or back-end processes, and general patterning steps as well as other plasma processes.

Source power may be applied to a coupling element (e.g. coils of a helical resonator) to generate a high-density plasma. Bias power may be applied to a substrate holder to couple energy to ions at a substrate supported by the substrate holder. The coupling element generates both reactive species and radicals in the plasma. Ion energy and ion angle may affect the quality, uniformity, selectivity, and predictability of a plasma process, as examples. Advanced pulsing techniques (APT) that modulate the application of source power and bias power during a plasma process may be particularly useful for controlling ion energy, ion angle (i.e. angle of incidence of ions at the substrate surface), and ion flux at the substrate. A combination of source power and bias power may be used to control energy and angle because the source power can control the current to the substrate while the bias power can control the voltage between the plasma and the substrate.

Managing by-products may be important because by-products may be the controlling factor for profile (e.g. the angle sidewalls make with the substrate). By-product generation, density, and removal may affect profile control (e.g. verticality of sidewalls), precision, cleanliness, rate and type of reactions taking place at the substrate, and the like. The presence of by-products may be a function of many things. For example, by-products may be generated at the substrate, but may also be altered by the plasma. Pressure may affect the liberation of by-products from the substrate and the redeposition of by-products onto the substrate. By-products may be generated in-feature and deposited directly on sidewalls. Additionally, by-products may affect deposition profile (e.g. verticality of feature sidewalls) as well as plasma uniformity.

If may be difficult to achieve the desired plasma processing results when the quantity and density of by-products in a plasma processing system are not specifically controlled. In particular, by-products may present a problem due to passive participation during plasma processing. For example, by-products may be altered by the plasma after being released into a region near the substrate during an etching process. Subsequently, the by-products may be redeposited onto the substrate and/or removed due to gas flow. It may be desirable to maintain the density or flux of by-products at a substrate within a certain range in order to achieve desired plasma processing results.

Various embodiments described herein may advantageously separate control into three independent operating phases: reactive species control, ion/radical control, and by-product control. During each control phase, a set of process parameters may be controlled in such a way as to primarily or entirely influence a specific set of plasma processing characteristics. In this way, a possible benefit of true functional separation may be achieved in a plasma process. Separate management of the three sets of process parameters may advantageously enable high precision topographical control during plasma processing.

During the reactive species control phase, the generation of reactive species may be controlled. In the ion/radical control phase, various plasma processing characteristics related to ions and radicals may be controlled such as the ratio of ions to radicals, ion energy, ion angle, and ion flux at the substrate. During the by-product control phase, plasma processing characteristics related to by-products may be controlled such as the quantity of by-products and the ratio of by-products to ions/radicals. For example, by-products may be removed from the system during the by-product control phase.

Further, each control phase may be implemented during a cycle that is repeated multiple times during a plasma process. A repeated process with multiple control phases may advantageously provide a larger variation of process parameters (e.g. ion/radical ratio, energy, etc.) than can be achieved during a continuous, non-repetitive process. Additionally, continual control of the plasma processing characteristics in every cycle may advantageously reduce the need for or eliminate complex self-limiting processes that hurt productivity (e.g. throughput). For example, both atomic layer etching (ALE) and atomic layer deposition (ALD) techniques modify individual monolayers of a substrate by using self-limiting chemistry to etch only chemically-modified surface monolayers. During a conventional ALE process, a single monolayer may be removed every 50 ms to 100 ms due to the self-limiting processes. Throughput may also be impacted by the need for gas switching and/or purging. A benefit of various embodiments described herein may be to achieve high etching and deposition precision with high throughput by eliminating or reducing the self-limiting processes.

Additionally, etching by-products may be prone to build up over time while a substrate is being etched in conventional plasma processing techniques. Various embodiments as described herein may include a by-product removal phase in every cycle advantageously reducing or eliminating undesirable accumulation of by-products from cycle to cycle (e.g. over timescales larger than a residence time). A set of process parameters may be adjusted to appropriate values corresponding to each control phase for a given plasma process. These process parameters may include source pulse parameters (e.g. source power), bias pulse parameters (e.g. bias power), and phase duration, among others. For example, additional process parameters may also be included such as delay between adjacent phases, gas flowrate, pulse shape, pulse frequency, number of pulses, gas composition, bias polarity, and others.

Embodiments provided below described various systems and methods for plasma processing, and in particular, systems and methods for plasma processing that use three-phase pulsing. The following description describes the embodiments. An example schematic timing diagram of an embodiment plasma processing method is described using FIG. 1. Several other example schematic timing diagrams of embodiment plasma processing methods are described using FIGS. 2-4. An example block diagram of an embodiment plasma processing system is described using FIG. 5. Two example schematic diagrams of an inductively coupled plasma processing apparatus are described using FIGS. 6A and 6B. Two embodiment methods of plasma processing are described using FIGS. 7 and 8.

FIG. 1 illustrates a schematic timing diagram of an example plasma processing method and a corresponding qualitative graph in accordance with an embodiment of the invention.

Referring to FIG. 1, a schematic timing diagram 100 includes source power $P_S$ and bias power $P_B$ which are pulsed to generate reactive species, energetic ions, and by-products during a cycle 150 which includes three phases: a first phase 110, a second phase 120, and a third phase 130. In various embodiments, cycle 150 is a sequential cycle (e.g. the phases are performed in order). Additionally, cycle 150 is repeatedly (i.e. cyclically) performed in some embodiments. In various embodiments, cycle 150 is repeatedly performed many times (e.g. >>1). For example, cycle 150 may be a sequential cycle of power pulses during which source pulses are applied to a plasma processing apparatus (e.g. to a coupling element) and bias pulses are applied to the plasma processing apparatus (e.g. to a substrate holder supporting a substrate). As a result, the three phases may also be referred to as pulsing phases.

Each of the three phases is defined by a set of process parameters that are adjusted accordingly during a given phase. The set of process parameters includes a source power level, a bias power level, and a phase duration. A given parameter in the set of process parameters may be substantially constant for a given phase. For example, the first phase 110 is defined by a first source power level $P_{S1}$, a first bias power level $P_{B1}$, and a first phase duration $t_1$. Similarly, the second phase 120 and the third phase 130 are defined by a second source power level $P_{S2}$, a second bias power level $P_{B2}$, and a second phase duration $t_2$ and a third source power level $P_{S3}$, a third bias power level $P_{B3}$, and a third phase duration $t_3$ respectively.

The first phase 110 may be considered a reactive species control phase. For inductive, wave heated, or resonant sources, reactive species generation may scale directly with source power $P_S$. For this reason, the first source power level $P_{S1}$ is on during the reactive species control phase in various embodiments. In one embodiment, the first source power level $P_{S1}$ is greater than zero while the bias power $P_B$ is off (i.e. the first bias power level $P_{B1}$ equals zero or substantially zero) during the reactive species control phase. The reactive species control phase may be thought of as a source power phase inasmuch as the source power $P_S$ to the plasma system is on during the phase.

In other embodiments, the source power $P_S$ and the bias power $P_B$ are both on during the reactive species control phase. For example, bias power $P_B$ may be maintained or pulsed during the reactive species control phase to affect ion energy which may control growth during deposition processes and/or maintain cleanliness by removing depositing species generated along with electrons, ions, and radicals.

As shown in qualitative graph 102, the electron density $N_e$ and radical density $N_r$ are high during the first phase 110. For example, the radical density $N_r$ increases initially and then is maintained at a high level during the first phase 110. The electron density $N_e$ increases rapidly at the beginning of the first phase 110 and continues to increase throughout the first phase 110. The ion density is proportional to the electron density $N_e$. The electron temperature $T_e$ and the ion energy $\varepsilon_i$ both spike at the start of the first phase 110 and then maintain a substantially constant value for the remainder. Although small in comparison to the reactive species in the first phase 110, by-products may also be generated during the first phase 110. As shown, the by-product density $N_{bp}$ may gradually increase during the first phase 110.

The second phase 120 may be considered an ion/radical control phase. During the ion/radical control phase, the source power $P_S$ is reduced compared to the reactive species control phase. For example, the source power $P_S$ may be turned off for the duration of the ion/radical control phase. The reduction or removal of the source power $P_S$ in the ion/radical control phase may decrease or eliminate current to the substrate. Further, the applied bias power $P_B$ may increase the voltage. During the ion/radical control phase, the second bias power level $P_{B2}$ is greater than the second source power level $P_{S2}$. Similarly, the second source power level $P_{S2}$ is less than the first source power level $P_{S1}$.

As shown in the qualitative graph 102, the electron density $N_e$ decreases quickly while the radical density $N_r$ remains relatively constant (e.g. decreases at a much lower rate). The electron temperature $T_e$ also maintains a substantially constant value during the second phase 120 in comparison to the first phase 110. Meanwhile, the ion energy $\varepsilon_i$ quickly increases to a substantially constant value. Notably, by-products may be generated during the second phase 120 due to etching or other plasma processes. As shown, the by-product density $N_{bp}$ increases faster in the second phase 120 than in the first phase 110.

Several plasma processing characteristics may be influenced during the second phase 120. For example, the electron flux $\Gamma_e$ and the ion flux $\Gamma_i$ at the substrate may decrease while the energy flux $\Gamma_{energy}$ at the substrate may increase. Additionally, the radical flux $\Gamma_r$ may remain the same or change gradually relative to the ion flux $\Gamma_i$ resulting in an increase in the ratio of radicals to ions at the substrate (e.g. $\Gamma_r \gg \Gamma_i$). For example, in cases where the residence time $T_{res}$ is longer than the duration of the ion/radical control phase (second duration $t_2$), the radical flux $\Gamma_r$ may not decrease appreciably compared to the ion flux $\Gamma_i$. In this regime, the radical flux $\Gamma_r$ may be considered constant and the ion flux $\Gamma_i$ may be considered transient resulting in the ratio of the radical flux $\Gamma_r$ to the ion flux $\Gamma_i$ becoming large.

The third phase 130 may be considered a by-product control phase. As previously mentioned, by-products may be generated during the second phase 120, which may or may not be desirable in various concentrations at the substrate. For example, by-products may be generated which may affect the plasma process favorably within a range of concentrations at the substrate. However, in the absence of a by-product control phase, the by-products may undesirably accumulate so as to exceed the favorable range. The by-products can accumulate cycle-to-cycle over multiple residence times which may exaggerate the discrepancy and compound negative effects that the by-products may have on the plasma process. For example the by-products may change the plasma character between cycles.

During the by-product control phase, the source power $P_S$ is reduced compared to the first phase 110 (e.g. the reactive species generation phase) and the bias power $P_B$ is reduced compared to the second phase 120 (e.g. the ion/radical control phase). In one embodiment, the third source power level $P_{S3}$ and the third bias power level $P_{B3}$ are reduced to zero or substantially zero. Alternatively, the third source power level $P_{S3}$ or the third bias power level $P_{B3}$ may be nonzero. When the source power $P_S$ and the bias power $P_B$ is off or low, the by-products may be removed. For example, species generation and etching processes may be reduced or eliminated during the by-product control phase advantageously allowing by-products to be pumped out at a faster rate than by-products are created.

Since the by-product density $N_{bp}$ at the substrate and in the plasma system is decreasing, the by-product flux $\Gamma_{bp}$ at the substrate may also decrease. Consequently, the ratio of the ions to by-products and the ratio of radicals to by-products can also be controlled during the by-product control phase. For example, as seen in the qualitative graph 102, the by-product density $N_{bp}$ in the system is changing (i.e. decreasing) at a much higher rate than both the radical density $N_r$ and the electron density $N_e$ (which is proportional to the ion density $N_i$). Consequently, both the ion to by-product ratio and the radical to by-product ratio may change during the by-product control phase.

The source power $P_S$ may be alternating current (AC) power. In some embodiments, the source power $P_S$ is radio frequency (RF) power and is very high frequency (VHF) in various embodiments. In some embodiments, the source power $P_S$ is between about 60 MHz and about 200 MHz. In other embodiments, the source power $P_S$ is between about 25 MHz and about 60 MHz and is 27 MHz in one embodiment. The source power $P_S$ may generate a capacitively coupled plasma (CCP), an inductively coupled plasma (ICP), a surface wave plasma (SWP), and others. For example, the source power $P_S$ may be coupled to a helical resonator antenna in order to generate a plasma.

Similarly, the bias power $P_B$ may be AC power. Alternatively, the bias power $P_B$ may be pulsed direct current (DC) power, for example. In some embodiments, the bias power $P_B$ is RF power and is high frequency (HF) in various embodiments and medium frequency (MF) in other embodiments. In some embodiments, the bias power $P_B$ is between about 200 kHz and about 600 kHz and is 400 kHz in one embodiment. In other embodiments, the bias power $P_B$ is between about 600 kHz and about 13 MHz.

The source power $P_S$ and the bias power $P_B$ may each be applied as a single pulse or a series of power pulses during each of the three phases. For example, a single source pulse may be applied within the first phase duration $t_1$ at a first source power level $P_{S1}$. Alternatively, a series of source pulses may be applied within the first phase duration $t_1$. Similarly, a single bias power pulse or a series of bias power pulses may be applied during the second phase duration $t_2$ at a second source power level $P_{B2}$.

A gas may be provided into a processing chamber of a plasma processing apparatus at a desired flowrate which may be chosen according to a given plasma process. The flowrate of a given plasma process may be maintained at a substantially constant value during cycle 150 (i.e. the first phase 110, the second phase 120, and the third phase 130). In one embodiment, the gas comprises hydrogen bromide (HBr). In various embodiments, the gas comprises an inert gas such as helium (He) or argon (Ar). The gas may also comprise oxygen ($O_2$), carbon tetrafluoride ($CF_4$), nitrogen trifluoride ($NF_3$), sulfur hexafluoride ($SF_6$), chlorine ($Cl_2$), carbon tetrachloride ($CCl_4$) and others.

By-products produced during the three phases (e.g. primarily in the second phase 120) may be compounds which include elements from one or more of the species in the gas of the processing chamber and/or elements from the substrate. For example, in the case of a substrate comprising silicon (Si) and a HBr gas, by-products comprising silicon bromides ($SiBr_x$) may be formed. Additionally or alternatively, other by-products may be formed such as silicon containing residues such as silicon fluorides ($SiF_x$) and silicon chlorides ($SiCl_x$), carbon containing residues (e.g. from photoresist, organic layers, or gas precursors) such as fluorocarbons ($CF_x$), hydrofluorocarbons ($CH_xF_y$), and others.

Figure 2:
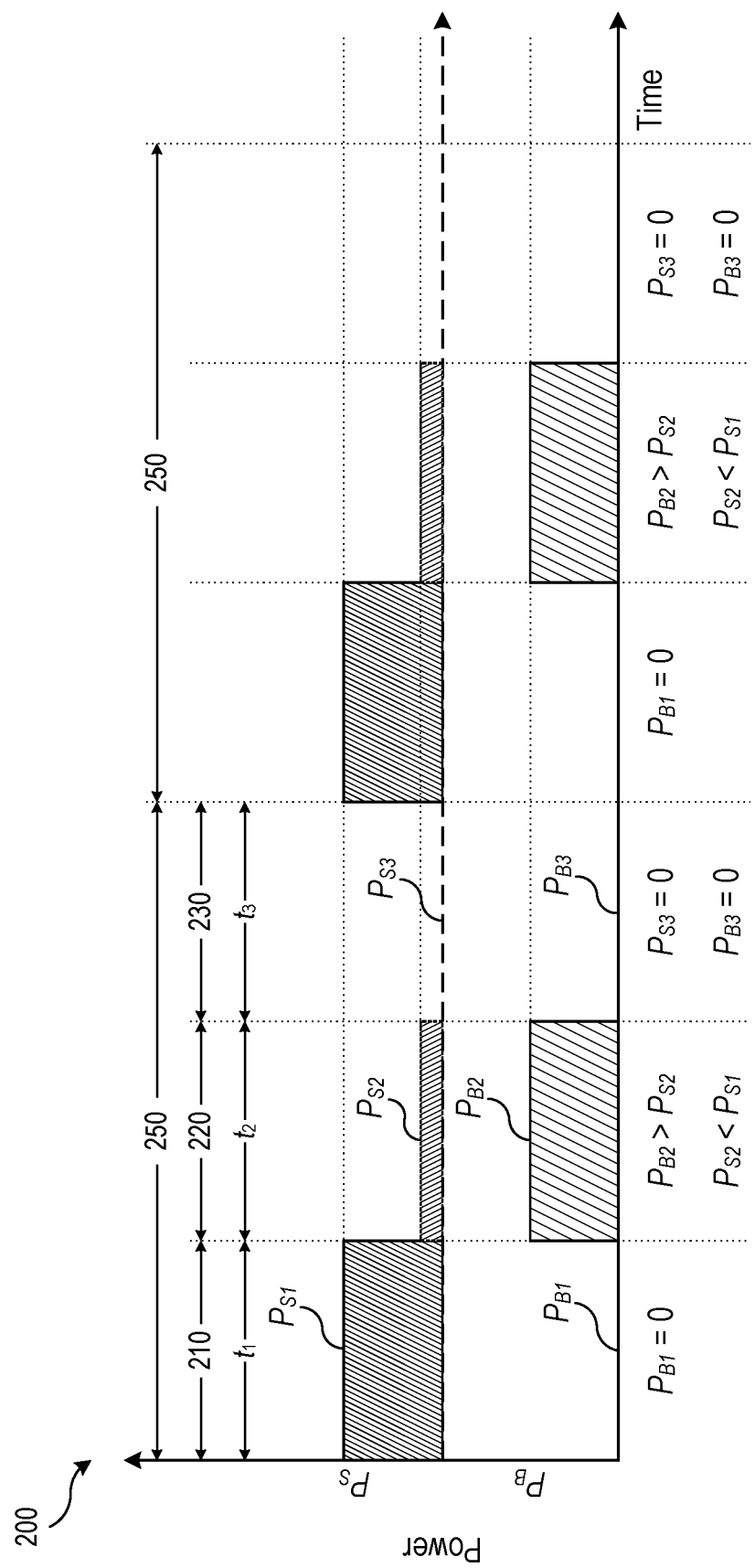
FIG. 2 illustrates a schematic timing diagram of another example plasma processing method in accordance with an embodiment of the invention.

FIG. 2 illustrates a schematic timing diagram of another example plasma processing method in accordance with an embodiment of the invention. The schematic timing diagram of FIG. 2 may be a specific implementation of other schematic timing diagrams as described herein, such as the schematic timing diagram 100 of FIG. 1, for example. Similarly labeled elements may be as previously described.

Referring to FIG. 2, a schematic timing diagram 200 includes source power $P_S$ and bias power $P_B$ which is pulsed to generate reactive species, ions, and by-products during a cycle 250 which includes three phases: a first phase 210, a second phase 220, and a third phase 230. The first phase 210, the second phase 220, the third phase 230, and cycle 250 may be specific implementations of the first phase 110, the second phase 120, the third phase 130, and cycle 150 of FIG. 1, respectively. For example, schematic timing diagram 200 applies to a specific example in which the bias power $P_B$ is (substantially) off in the first phase 210 and the third phase 230 and the source power $P_S$ is (substantially) off in the third phase 230.

As shown, cycle 250 is a sequential cycle of power pulses including a reactive species control phase (the first phase 210), an ion/radical control phase (the second phase 220), and a by-product control phase (the third phase 230) that is repeatedly (e.g. cyclically) performed during a plasma process. The first source power level $P_{S1}$ is greater than zero (i.e. source power $P_S$ is on) and the first bias power level $P_{B1}$ is zero or substantially zero (i.e. bias power $P_B$ is off) during the first phase 210. In various embodiments, the first source power level $P_{S1}$ is between about 700 W and about 900 W during the first phase 210 and is about 800 W during the first phase 210 in one embodiment. The first phase duration $t_1$ is between about 10 μs and about 100 μs in various embodiments. In one embodiment, the first phase duration $t_1$ is about 20 μs.

During the second phase 220, the second bias power level $P_{B2}$ is greater than the second source power level $P_{S2}$. Optionally, the source power $P_S$ is turned off (i.e. the second source power level $P_{S2}$ is zero or substantially zero) during the second phase 220. In various embodiments, the second bias power level $P_{B2}$ is between about 300 W and about 500 W during the second phase 220 and is about 400 W during the second phase 220 in one embodiment. The second phase duration $t_2$ is between about 20 μs and about 100 μs in various embodiments. In one embodiment, the second phase duration $t_2$ is about 70 μs.

During the third phase 230, the source power $P_S$ is off (i.e. the third source power level $P_{S3}$ is zero or substantially zero) and the bias power $P_B$ is off (i.e. the third bias power level $P_{B3}$ is zero or substantially zero). The third phase duration $t_3$ may be on the order of the local residence time of the gas at a surface of the substrate. By comparison, the residence time of by-products at the surface of the substrate may be much shorter (e.g. for high flowrates). Consequently, the by-products may advantageously be removed at a faster rate than the radicals at the surface of the substrate when the third phase duration $t_3$ is less than the local residence time of the gas. In various embodiments, the third phase duration $t_3$ is between about 50 μs and about 3 ms. In one embodiment, the third phase duration $t_3$ is about 100 In another embodiment, the third phase duration $t_3$ is about 1 ms.

Figure 3:
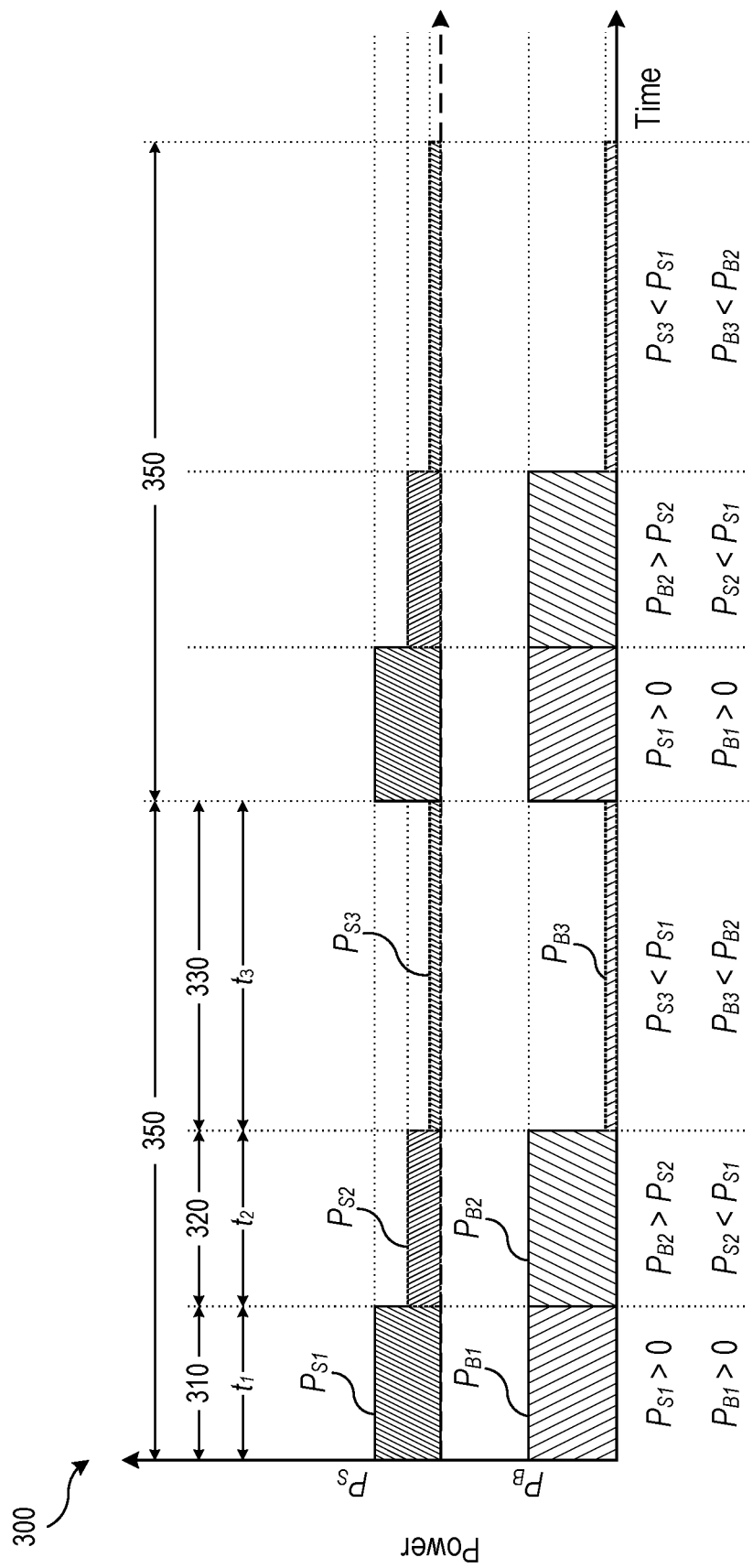
FIG. 3 illustrates a schematic timing diagram of still another example plasma processing method in accordance with an embodiment of the invention.

FIG. 3 illustrates a schematic timing diagram of still another example plasma processing method in accordance with an embodiment of the invention.

Referring to FIG. 3, a schematic timing diagram 300 includes source power $P_S$ and bias power $P_B$ which is pulsed to generate reactive species, ions, and by-products during a cycle 350 which includes three phases: a first phase 310, a second phase 320, and a third phase 330. The first phase 310, the second phase 320, the third phase 330, and cycle 350 may be specific implementations of the first phase 110, the second phase 120, the third phase 130, and cycle 150 of FIG. 1, respectively. For example, schematic timing diagram 300 applies to a specific example in which the source power $P_S$ and the bias power $P_B$ are on in the first phase 310.

As shown, cycle 350 is a sequential cycle of power pulses including a reactive species control phase (the first phase 310), an ion/radical control phase (the second phase 320), and a by-product control phase (the third phase 330) that is repeatedly (e.g. cyclically) performed during a plasma process. The first source power level $P_{S1}$ is greater than zero (i.e. source power $P_S$ is on) and the first bias power level $P_{B1}$ is also greater than zero (i.e. the bias power $P_B$ is on) during the first phase 310. The first bias lower level $P_{B1}$ may be higher than the first source power level $P_{S1}$ as shown. Alternatively, the first bias power level $P_{B1}$ can also be equal to or less than the first source power level $P_{S1}$.

In various embodiments, the first source power level $P_{S1}$ is between about 100 W and about 200 W during the first phase 310 and is about 150 W during the first phase 310 in one embodiment. In various embodiments, the first bias power level $P_{B1}$ is between about 400 W and about 600 W during the first phase 310 and is about 500 W during the first phase 310 in one embodiment. The first phase duration $t_1$ is between about 10 µs and about 100 µs in various embodiments. In one embodiment, the first phase duration $t_1$ is about 20 µs.

During the second phase 320, the second bias power level $P_{B2}$ is greater than the second source power level $P_{S2}$. The second source power level $P_{S2}$ is lower than the first source power level $P_{S1}$. Optionally, the source power $P_S$ is turned off (i.e. the second source power level $P_{S2}$ is zero or substantially zero) during the second phase 320. As shown, the second bias power level $P_{B2}$ may be (substantially) equal to the first bias power level $P_{B1}$ is some embodiments. Alternatively, the second bias power level $P_{B2}$ may also be greater than or less than the first bias power level $P_{B1}$.

In various embodiments, the second source power level $P_{S2}$ is between 0 W to about 100 W during the second phase 320. In one embodiment, the second source power level $P_{S2}$ is about 50 W during the second phase 320. In another embodiment, the second source power level $P_{S2}$ is 0 W during the second phase 320. In various embodiments, the second bias power level $P_{B2}$ is between about 400 W and about 600 W during the second phase 320 and is about 500 W during the second phase 320 in one embodiment. The second phase duration $t_2$ is between about 20 µs and about 100 µs in various embodiments. In one embodiment, the second phase duration $t_2$ is about 70 µs.

During the third phase 330, the source power $P_S$ is low (i.e. the third source power level $P_{S1}$ is less than the first source power level $P_{S1}$) and the bias power $P_B$ is also low (i.e. the third bias power level $P_{B3}$ is less than the second bias power level $P_{B2}$). The third phase duration $t_3$ may be on the on the order of the local residence time of the gas at a surface of the substrate (e.g. longer than the first phase duration $t_1$ and longer than the second phase duration $t_2$ as shown).

Figure 4:
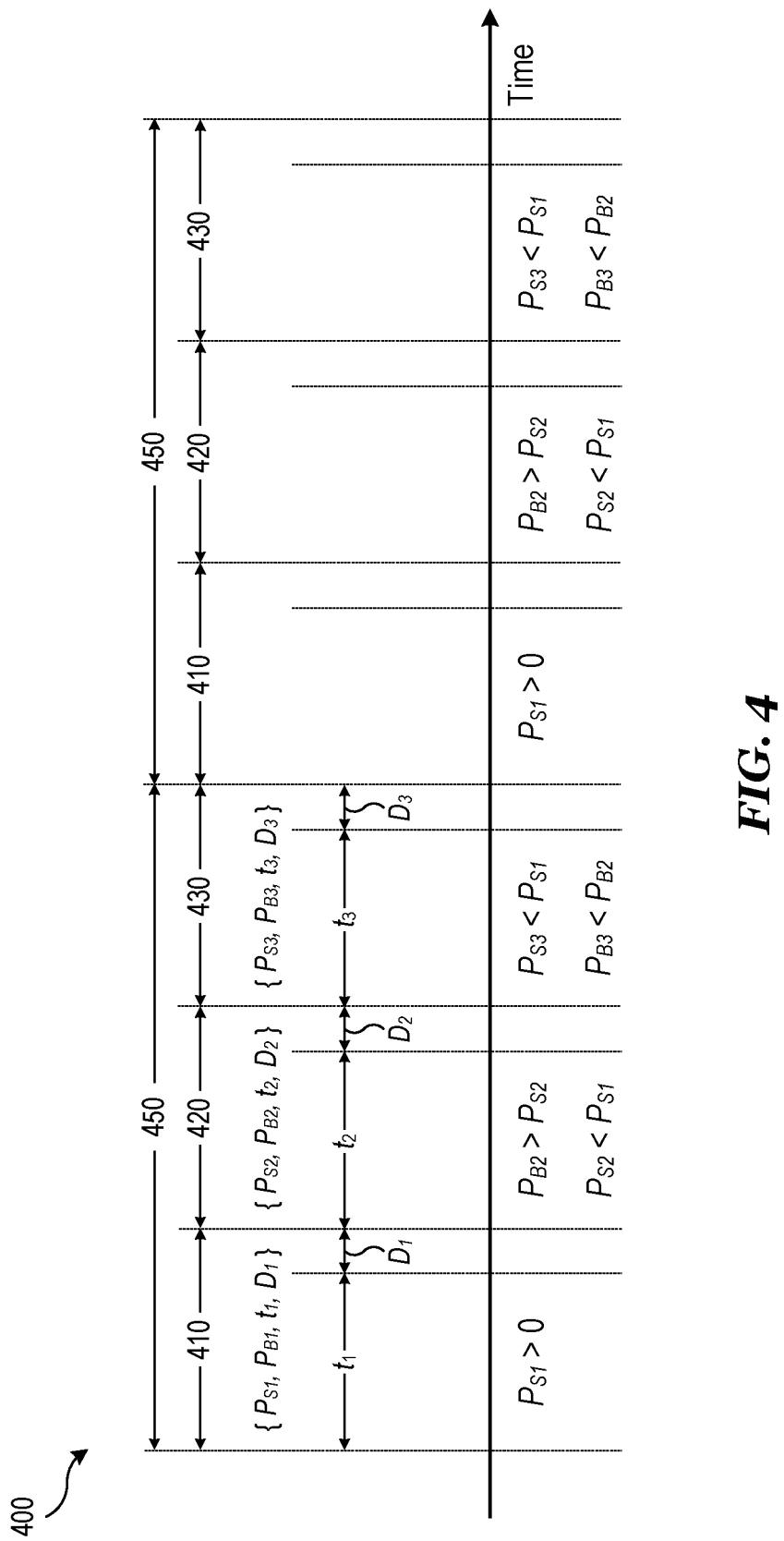
FIG. 4 illustrates a schematic timing diagram of still yet another example plasma processing method in accordance with an embodiment of the invention.

FIG. 4 illustrates a schematic timing diagram of still yet another example plasma processing method in accordance with an embodiment of the invention.

Referring to FIG. 4, a schematic timing diagram 400 includes source power $P_S$ and bias power $P_B$ which is pulsed to generate reactive species, ions, and by-products during a cycle 450 which includes three phases: a first phase 410, a second phase 420, and a third phase 430. The first phase 410, the second phase 420, the third phase 430, and cycle 450 may be specific implementations of the first phase 110, the second phase 120, the third phase 130, and cycle 150 of FIG. 1, respectively. Schematic timing diagram 400 applies to a specific example in which each of the three phases is further defined by an additional parameter that represents the delay D between adjacent phases.

As shown, cycle 450 is a sequential cycle of power pulses including a reactive species control phase (the first phase 410), an ion/radical control phase (the second phase 420), and a by-product control phase (the third phase 430) that is repeatedly (e.g. cyclically) performed during a plasma process. As before, the first phase 410 is characterized by the inequality $P_{S1}>0$, the second phase 420 is characterized by the inequalities $P_{B2}>P_{S2}$ and $P_{S2}<P_{S1}$, and the third phase 430 by the inequalities $P_{S3}<P_{S1}$ and $P_{B3}<P_{B2}$. However, an additional parameter representing the delay D between adjacent phases is also included. During a delay, both the source power $P_S$ and the bias power $P_B$ may be turned off or substantially off.

Specifically, in this example, the first phase 410, the second phase 420, and the third phase 430 are defined by the sets of parameters $\{P_{S1}, P_{B1}, t_1, D_1\}$, $\{P_{S2}, P_{B2}, t_2, D_2\}$, and $\{P_{S3}, P_{B3}, t_3, D_3\}$ respectively, where $D_1$ is a first delay between the first phase 410 and the second phase 420, $D_2$ is a second delay between the second phase 420 and the third phase 430, and $D_3$ is the delay between the third phase 430 and a subsequent first phase 410 of a new cycle 450 when cycle 450 is performed cyclically. Additionally or alternatively, the delay D between phases may also be negative resulting in an overlap between phases.

The delay parameter may be included in any of the embodiments described herein. For example, in various embodiments, the first delay $D_1$ may be between about 5 µs and about 15 µs and is about 10 µs in one embodiment. Such values of the first delay $D_1$ may be used in conjunction with examples as described in reference to FIG. 2, as well as others. In this specific example the first delay $D_1$ is shorter than both the first phase duration $t_1$ and the second phase duration $t_2$, but this does not have to be the case. In other embodiments, the first delay $D_1$ may be between about 500 µs and about 3 ms and is about 1 ms in one embodiment. Such values of the first delay $D_1$ may be used in conjunction with examples as described in reference to FIG. 3, as well as others. Here the first delay $D_1$ is longer than the first phase duration $t_1$ and the second phase duration $t_2$. The second delay $D_2$ and the third delay $D_3$ may be varied in a similar manner according to the desired properties of a given plasma process.

Schematic timing diagram 200 of FIG. 2 may be representative of a particular group of embodiment methods of plasma processing. For example, the schematic timing diagram 200 may be used during a silicon etching plasma process. The gases provided during the process may include, for example, an inert gas such as He or Ar, HBr, and small amounts of $O_2$ and/or $CF_4$. The first source power level $P_{S1}$ may be about 800 W, the first bias power level $P_{B1}$ may be zero or substantially zero, the first phase duration $t_1$ may be about 20 µs, and the first delay $D_1$ may be about 10 µs. Optionally, the first bias power level $P_{B1}$ may be about 500 W to keep feature walls at bottom surfaces clean. The second source power level $P_{S2}$ may be zero or substantially zero, the second bias power level $P_{B2}$ may be about 400 W, and the second phase duration $t_2$ may be about 70 µs. Optionally, the second source power level $P_{S2}$ may be about 100 W to increase the flux during the second phase. The third source power level $P_{S3}$ and the third bias power level $P_{B3}$ may be zero or substantially zero while the third phase duration $t_3$ may a value in the range of hundreds of microseconds (e.g. 100 µs) to several milliseconds (e.g. 3 ms).

Similarly, schematic timing diagram 300 may be representative of a different group of embodiment methods of plasma processing. For example, the schematic timing diagram 300 may be used during a silicon nitride etching process. This etching process may be similar to an atomic layer etching (ALE), for example. The gases provided during the process may include, for example, an inert gas such as Ar, and small amounts (e.g. 5%) of a fluorinated carbon such as $C_4F_6$ or $C_4F_5$. The first source power level $P_{S1}$ may be between about 100 W and about 200 W, the first bias power level $P_{B1}$ may be about 500 W, and the first delay $D_1$ may be on the order of the ambipolar diffusion time of the plasma. The ambipolar diffusion time may be long relative to the first phase duration $t_1$ and the second phase duration $t_2$. As mentioned above, the first bias power level $P_{B1}$ may be about 500 W to keep feature walls at bottom surfaces clean which may be important when fluorine is involved. For example bias power may be needed in the first phase to control polymerization at the substrate. The second source power level $P_{S2}$ may be zero or substantially zero and the second bias power level $P_{B2}$ may be about 500 W. The second bias power level $P_{B2}$ may be higher than in silicon etching plasma processes. Optionally, the second source power level $P_{S2}$ may be between 0 W and about 100 W to increase the flux during the second phase. The third source power level $P_{S3}$ and the third bias power level $P_{B3}$ may be zero or substantially zero while the third phase duration $t_3$ may a value in the range of hundreds of microseconds (e.g. 100 µs) to several milliseconds (e.g. 3 ms).

Figure 5:
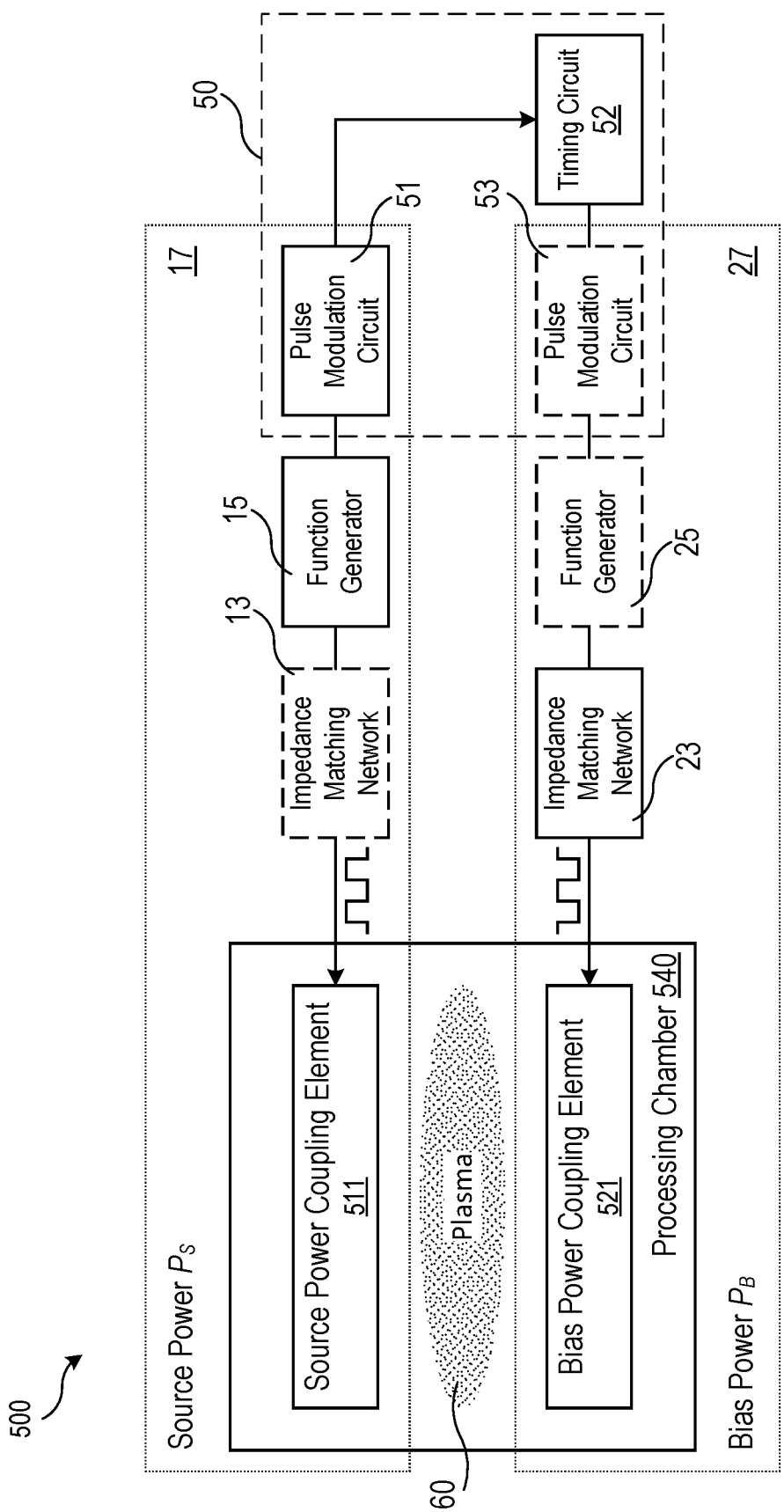
FIG. 5 illustrates a block diagram of an example plasma processing system in accordance with an embodiment of the invention.

FIG. 5 illustrates a block diagram of an example plasma processing system in accordance with an embodiment of the invention. The plasma processing system of FIG. 5 may be used to implement the schematic timing diagrams perform any of the embodiment methods as described herein, such as the schematic timing diagram of FIG. 1, for example. Furthermore, the plasma processing system of FIG. 5 may be used to perform any of the embodiment methods as described herein, such as the methods of FIGS. 7 and 8, for example.

Referring to FIG. 5, a plasma processing system 500 includes a source power coupling element 511 coupled to a processing chamber 540. The source power coupling element 511 may be disposed in the processing chamber 540 or adjacent to the processing chamber 540. The source power coupling element 511 may allow application of source power $P_S$ to the processing chamber 540 resulting in the generation of a plasma 60. In various embodiments, the source power coupling element 511 is a conductive coil positioned around the processing chamber 540 and is a quarter-wave helical resonator in one embodiment. In another embodiment, the source power coupling element 511 is a half-wave helical resonator that may implemented as a planar spiral coil positioned above the processing chamber 540. Alternatively, other source power coupling elements may be employed, such as an antenna, an electrode, a waveguide, or an electron beam, as examples.

The plasma processing system 500 further includes a bias power coupling element 521 coupled to the processing chamber 540. The bias power coupling element 521 may enable application of bias power $P_B$ to a microelectronic workpiece being processed. In various embodiments, the bias power coupling element 521 is a substrate holder and is an electrostatic chuck in one embodiment. The bias power coupling element 521 may also refer to a substrate holder supporting a substrate or simply to the substrate itself.

The source power $P_S$ may be coupled to the processing chamber 540 using a source power control path 17 which includes a source power pulse modulation circuit 51. The source power pulse modulation circuit 51 may modulate a source signal between a high amplitude state and a low amplitude state. The modulated source signal may be received by a function generator 15 which may superimpose a waveform onto the modulated source signal. The function generator 15 may also optionally include an amplification circuit configured to increase the amplitude of the modulated source signal.

The frequency of the superimposed waveform may be higher than the pulse modulation frequency. In various embodiments, the frequency of the superimposed waveform may be an RF frequency and is about 13.56 MHz in one embodiment. As a result, each of the resulting source power pulses may include several cycles of the superimposed waveform. The waveform shape may include a periodic waveform such as a sinusoidal wave, a square wave, a sawtooth wave, and the like. Alternatively, the waveform shape may include an aperiodic wave such as a superposition of multiple sinusoidal waves of various frequencies to generate an arbitrary waveform shape.

The source power control path 17 may include an optional source impedance matching network 13. The source power pulses generated by the function generator 15 may pass through the optional source impedance matching network 13 before being coupled to the processing chamber 540 by the source power coupling element 511. The optional source impedance matching network 13 may be omitted in certain plasma processing systems such as when the source power coupling element 511 is a resonant structure inductively coupled to the plasma 60. Conversely, the optional source impedance matching network 13 may be included when the source power coupling element 511 is non-resonant. The optional source impedance matching network 13 may be used to ensure that the source power $P_S$ is efficiently coupled to the plasma 60 by matching the impedance of the load to the impedance of the supply.

Still referring to FIG. 5, the bias power $P_B$ may be coupled to the processing chamber 540 using a bias power control path 27. The bias power control path 27 may be coupled to the source power control path 17 through a pulse modulation timing circuit 52. The pulse modulation timing circuit 52 may determine the timing of bias power pulses relative to the timing of source power pulses generated by the source power control path 17. The pulse modulation timing circuit 52 may receive a signal from the source power pulse modulation circuit 51 and introduce a delay triggered by either the leading edge or the trailing edge of a source power pulse. Alternatively, the pulse modulation timing circuit 52 may determine the timing of source power pulses relative to the timing of bias power pulses generated by the bias power control path 27.

Similar to the source power control path 17, the bias power control path 27 may include an optional bias power pulse modulation circuit 53 triggered by the pulse modulation timing circuit 52. The optional bias power pulse modulation circuit 53 may modulate a bias signal between a high amplitude state and a low amplitude state. Alternatively, the optional bias power pulse modulation circuit 53 may be omitted and a delayed modulated source signal may correspond with the bias power pulses.

The modulated bias signal may be received by an optional function generator 25. The optional function generator 25 may superimpose a waveform onto the modulated bias signal. The waveform may be similar or different than the waveform superimposed on the modulated source signal and may have any desired waveform shape as previously described. The optional function generator 25 may also optionally include an amplification circuit to increase the amplitude of the modulated bias signal. In one embodiment, the bias power $P_B$ delivered to the processing chamber 540 is AC power. Alternatively, the bias power delivered to the processing chamber 540 is DC power. In this case, the optional function generator 25 may be omitted. In some cases where amplification is needed, but function generation is not, an amplification circuit may be included instead of the optional function generator 25.

A bias power impedance matching network 23 is also included in the bias power control path 27 between the optional function generator 25 and the bias power coupling element 521. The bias power impedance matching network 23 may be used to ensure that the bias power $P_B$ is efficiently coupled to the processing chamber 540 by matching the impedance of the load to the impedance of the supply.

One or more of the elements described above may be included in a controller. For example, as shown in FIG. 5, the source power pulse modulation circuit 51, pulse modulation timing circuit 52, and optional bias power pulse modulation circuit 53 may be included in a controller 50. The controller 50 may be locally located relative to the processing chamber 540. Alternatively, controller 50 may be located remotely relative to the processing chamber 540. The controller 50 may be capable of exchanging data with one or more of the elements included in the source power control path 17 and the bias power control path 27. Each of the impedance matching networks may be controlled by controller 50 or may include a separate controller.

The controller 50 may be configured to set, monitor, and/or control various process parameters associated with generating a plasma and processing a microelectronic workpiece using embodiment three-phase cycles described herein. Process parameters may include, but are not limited to power level, frequency, and duty cycle percentage for both the source power and the bias power, as well as phase duration, delay between adjacent phases, gas flowrate, pulse shape, pulse frequency, number of pulses, gas composition, bias polarity, and others. Other process parameters may also be used.

Figure 6A:
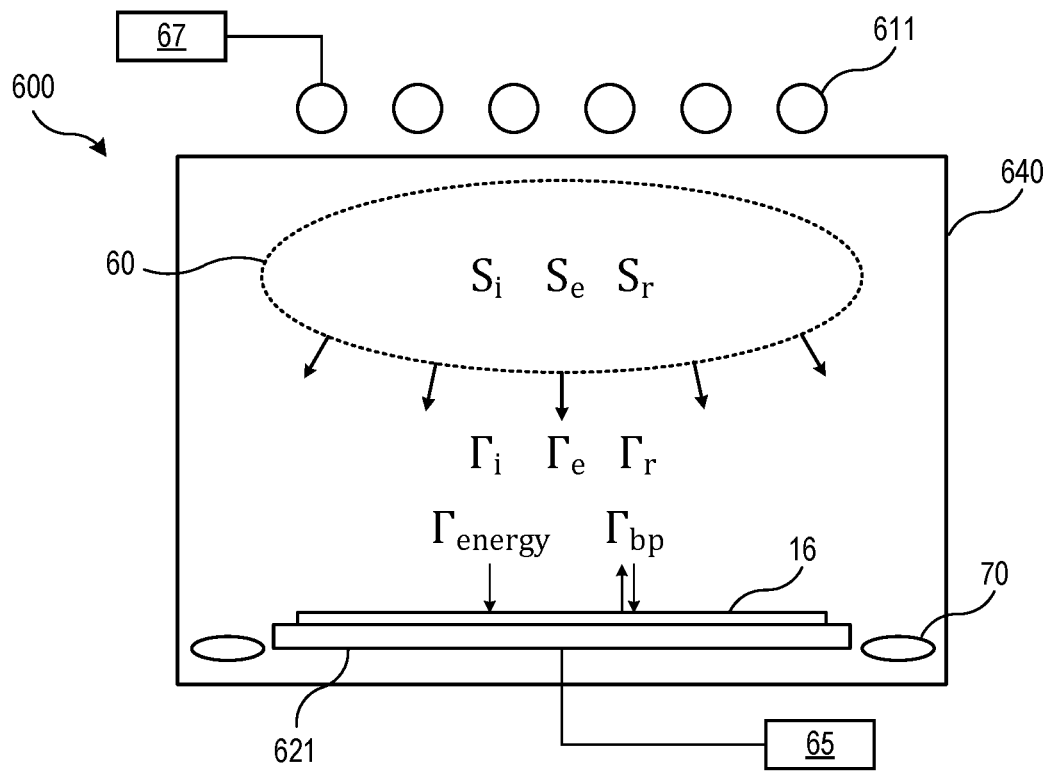
FIG. 6A, 6B and FIG. 6C illustrate schematic diagrams of an inductively coupled plasma processing apparatus in accordance with an embodiment of the invention, where
Figure 6B:
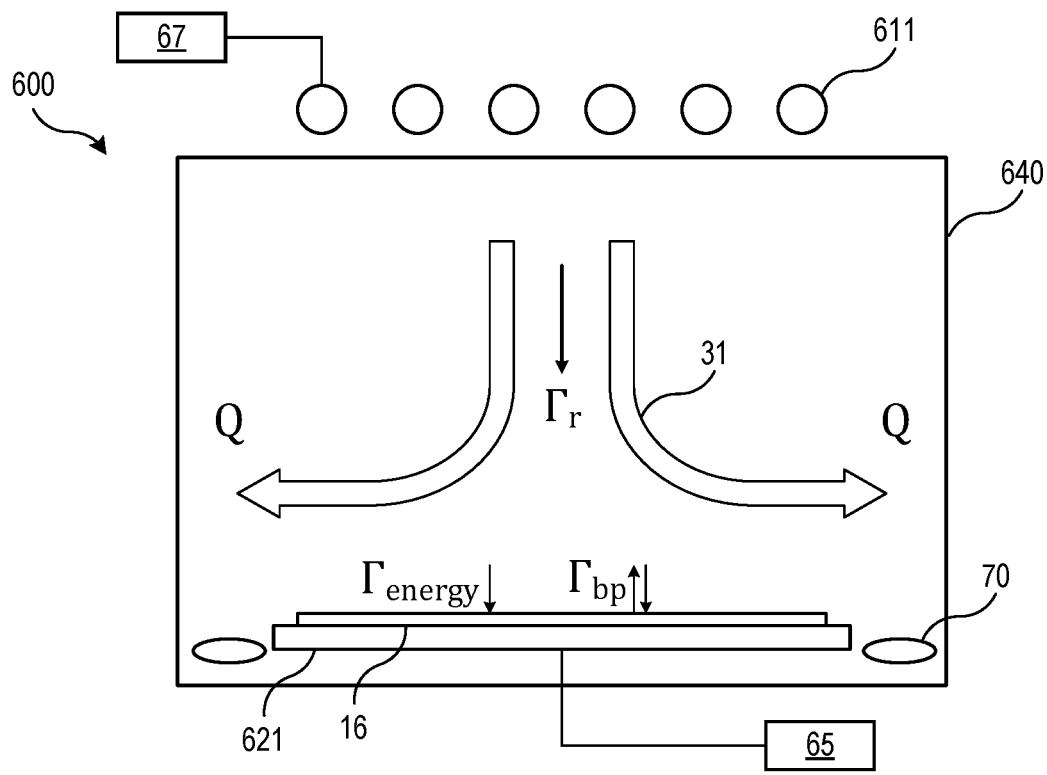
Figure 6C:
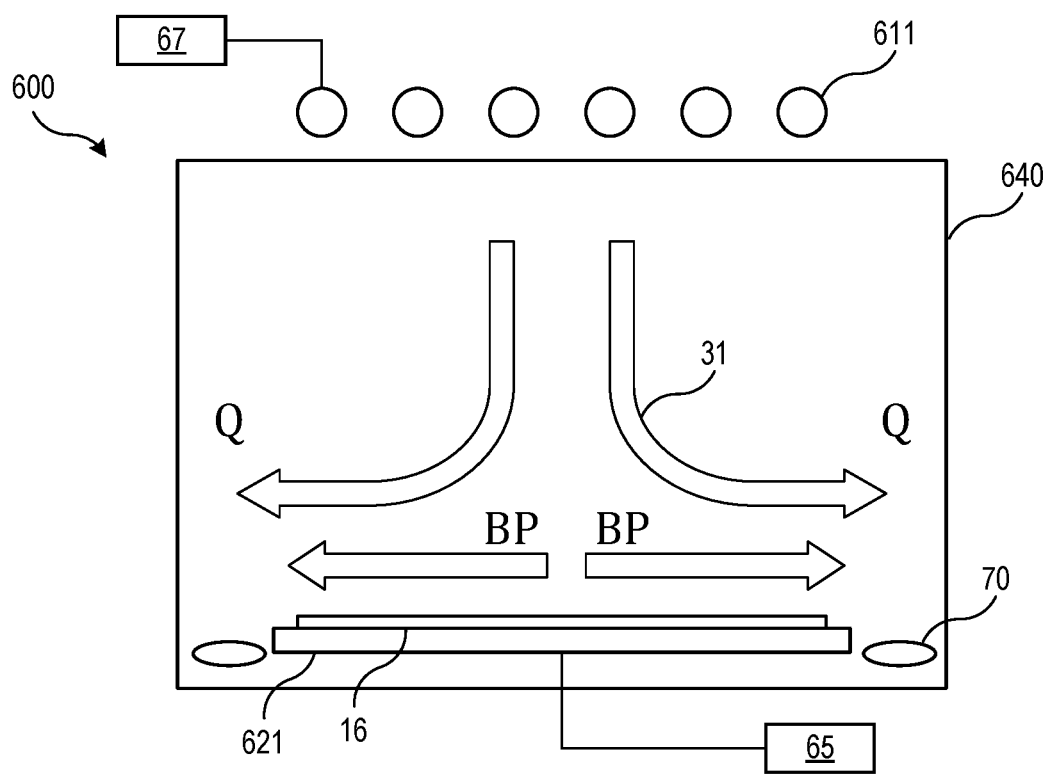

FIG. 6A, 6B and FIG. 6C illustrate schematic diagrams of an inductively coupled plasma processing apparatus in accordance with an embodiment of the invention, where FIG. 6A illustrates the inductively coupled plasma processing apparatus during a reactive species control phase, FIG. 6B illustrates the inductively coupled plasma processing apparatus during an ion/radical control phase, and FIG. 6C illustrates the inductively coupled plasma processing apparatus during a by-product control phase.

Referring to FIGS. 6A, 6B, and 6C, an inductively coupled plasma (ICP) processing system 600 includes AC source power supply 67 which may include a generator circuit. The AC source power supply 67 is coupled to an inductive element 611 which is disposed adjacent to a processing chamber 640. In one embodiment, the inductive element 611 is a planar coil as shown. In other embodiments, the inductive element 611 is a helical resonator coil. The inductive element 611 may be a specific implementation of the source power coupling element 511 of FIG. 5, for example. A bias power supply 65 which may also include a generator circuit is coupled to a substrate holder 621 which may support a substrate 16. The substrate holder 621 may be a specific implementation of the bias power coupling element 521 of FIG. 5, for example.

One or more pump outlets 70 are also included in the processing chamber 640. Gas flowrates through the pump outlets 70 may contribute favorably to the removal of by-products from the processing chamber 640. In various embodiments, the pump outlets 70 are disposed near (e.g. below and around the perimeter of) the substrate holder 621 and the substrate 16.

The AC source power supply 67 and the bias power supply 65 may respectively generate source power $P_S$ and bias power $P_B$ in accordance with the embodiments described previously such as in FIGS. 1-5. A plasma 60 is formed proximate the substrate 16 between the inductive element 611 (e.g., a planar, or solenoidal/helical coil or antenna) and the substrate holder 621. A dielectric material (not shown) may separate the inductive element 611 from the plasma 60.

Referring now to FIG. 6A, a plasma 60 may be generated during a reactive species control phase of a plasma process. The plasma 60 may act as a source of various species such as an ion source $S_i$, an electron source $S_e$, and a radical source $S_r$ which may produce corresponding fluxes (the ion flux $\Gamma_i$, the electron flux $\Gamma_e$, and the radical flux $\Gamma_r$) that disperse in all directions from the plasma 60. By-products may also be generated during the reactive species control phase which is denoted by a by-product flux $\Gamma_{bp}$ at the substrate 16. Energy may also be transferred to the substrate 16 during the reactive species control phase as depicted by the energy flux $\Gamma_{energy}$.

Referring now to FIG. 6B, the plasma 60 (although not shown) may still be present in the ion/radical control phase (e.g. as an afterglow) although the electron flux $\Gamma_e$ and the ion flux $\Gamma_i$ may decrease while the energy flux $\Gamma_{energy}$ may increase at the substrate 16. A flowrate Q may carry species toward sidewalls of the processing chamber 640. During the ion/radical control phase the radical flux $\Gamma_r$ may remain substantially constant as indicated by the arrow towards the substrate 16. The substantially constant radical flux $\Gamma_r$ in combination with the decreasing ion flux $\Gamma_i$ may decrease the ratio of ions to radicals during the ion/radical control phase.

Referring now to FIG. 6C, the plasma 60 may or may not be present in the by-product control phase due to very low or zero source power as shown. During the by-product control phase, the flowrate Q continues towards the sides of the processing chamber 640 and the gas flow 31 may carry by-products to pump outlets 70 at a faster rate than new by-products are generated. This may reduce the by-product flux $\Gamma_{bp}$ at the substrate 16 and introduce and/or enhance a by-product flowrate BP which transports by-products to the sides of the processing chamber 640 and to the pump outlets 70. As in the ion/radical control phase, the radical flux $\Gamma_r$ may continue to remain substantially constant (e.g. decrease very slowly relative to the duration of the by-product control phase).

FIG. 7 illustrates an example method of plasma processing in accordance with an embodiment of the invention. The method of FIG. 7 may be performed using embodiment schematic timing diagrams and embodiment plasma processing systems and apparatuses as described herein. For example, the method of FIG. 7 may be combined with any of the embodiments of FIGS. 1-6. It is noted that while arrows are intended to illustrate a particular order of events, the method as shown in FIG. 7 is not intended to be limited to a particular order. Accordingly, the below method steps may be performed in any suitable order as may be apparent to a person of skill in the art.

Step 710 of a method 700 of plasma processing includes applying a source power pulse to a plasma processing chamber during a first phase defined by a first set of process parameters: $\{P_{S1}, P_{B1}, t_1\}$ where $P_{S1}>0$. Step 720 includes applying a bias power pulse to a substrate in the plasma processing chamber during a second phase defined by a second set of process parameters: $\{P_{S2}, P_{B2}, t_2\}$ where $P_{S2}<P_{S1}$ and $P_{B2}>P_{S2}$. Step 730 includes reducing a quantity of by-products in the plasma processing chamber during a third phase defined by a third set of process parameters: $\{P_{S3}, P_{B3}, t_3\}$ where $P_{S3}<P_{S1}$ and $P_{B3}<P_{B2}$. As shown, the combination of step 710, step 720, and step 730 is a cycle 750. Step 710 may be repeated after step 730 as indicated by the dashed arrow.

FIG. 8 illustrates another example method of plasma processing in accordance with an embodiment of the invention. The method of FIG. 8 may be performed using embodiment schematic timing diagrams and embodiment plasma processing systems and apparatuses as described herein. For example, the method of FIG. 8 may be combined with any of the embodiments of FIGS. 1-6. It is noted that while arrows are intended to illustrate a particular order of events, the method as shown in FIG. 8 is not intended to be limited to a particular order. Accordingly, the below method steps may be performed in any suitable order as may be apparent to a person of skill in the art.

Step 810 of a method 800 of plasma processing includes pulsing source power to a processing chamber to generate ions and radicals in a plasma. Step 820 includes reducing the source power to the processing chamber and pulsing bias power to a substrate of the processing chamber. Step 830 includes reducing the source power to the processing chamber and reducing the bias power to the substrate. As shown, the combination of step 810, step 820, and step 830 is a cycle 850. Step 810 may be repeated after step 830 as indicated by the dashed arrow.

Example embodiments of the invention are summarized here. Other embodiments can also be understood from the entirety of the specification as well as the claims filed herein.

Example 1. A method of plasma processing, the method including: performing a reactive species control phase including pulsing source power to a processing chamber to generate ions and radicals in a plasma; performing an ion/radical control phase after the reactive species control phase, the ion/radical control phase including reducing the source power to the processing chamber and pulsing bias power to a substrate in the processing chamber; and performing a by-product control phase after the ion/radical control phase, the by-product control phase including reducing the source power to the processing chamber relative to the reactive species control phase and reducing the bias power to the substrate relative to the ion/radical control phase.

Example 2. The method of example 1, further including: cyclically performing the reactive species control phase, the ion/radical control phase, and the by-product control phase.

Example 3. The method of one of examples 1 and 2, further including: providing a gas to the processing chamber, wherein a flowrate of the gas is substantially constant during the reactive species control phase, the ion/radical control phase, and the by-product control phase.

Example 4. The method of one of examples 1 to 3, wherein: the reactive species control phase further includes pulsing the bias power to the substrate.

Example 5. The method of one of examples 1 to 4, wherein the by-product control phase further includes: reducing the source power to substantially zero for all of the by-product control phase; and reducing the bias power to substantially zero for all of the by-product control phase.

Example 6. The method of one of examples 1 to 5, wherein the by-product control phase further includes: pulsing the bias power to the substrate to control redeposition of by-products at the substrate.

Example 7. An apparatus configured to perform the method of one of examples 1 to 6, the apparatus including: a coupling element disposed adjacent to the processing chamber; a substrate holder supporting the substrate; a source power supply node coupled to the coupling element and configured to pulse the source power; and a bias power supply node coupled to the substrate holder and configured to pulse the bias power.

Example 8. A method of plasma processing, the method including: processing a substrate using a cycle of power pulses during which source power pulses are applied to a coupling element and bias power pulses are applied to a substrate holder supporting a substrate; wherein the cycle of power pulses includes a first phase including a first source power level and a first bias power level, a second phase including a second source power level and a second bias power level, and a third phase including a third source power level and a third bias power level; wherein the first bias power level is greater than zero; wherein the second source power level is less than the first source power level; wherein the second bias power level is greater than the second source power level; wherein the third source power level is less than the first source power level; and wherein the third bias power level is less than the second bias power level.

Example 9. The method of example 8, further including repeatedly performing the cycle of power pulses.

Example 10. The method of one examples 8 and 9, wherein the first bias power level is substantially zero.

Example 11. The method of one of examples 8 to 10, wherein the first bias power level is greater than zero.

Example 12. The method of one of examples 8 to 11, wherein the third bias power level is greater than zero.

Example 13. The method of one of examples 8 to 12, wherein both the third source power level and the third bias power level are substantially zero.

Example 14. An apparatus configured to perform the method of one of examples 8 to 13, the apparatus including: a processing chamber; a source power supply node coupled to the coupling element and configured to generate the source power pulses; and a bias power supply node coupled to the substrate holder and configured to generate the bias power pulses.

Example 15. A method of plasma processing, the method including: applying a source power pulse to a plasma processing chamber during a first phase including a first source power level greater than zero, and a first bias power level; applying a bias power pulse to a substrate in the plasma processing chamber during a second phase after the first phase, the second phase including a second source power level less than the first source power level, and a second bias power level greater than the second source power level; and reducing a quantity of by-products in the plasma processing chamber during a third phase after the second phase, the third phase including a third source power level less than the first source power level, and a third bias power level less than the second bias power level.

Example 16. The method of example 15, wherein both the third source power level and the third bias power level are substantially zero.

Example 17. The method of one of examples 15 and 16, further including: cyclically performing the first phase, the second phase, and the third phase.

Example 18. The method of one of examples 15 to 17, wherein a gas flowrate is maintained at a substantially constant value during the first phase, the second phase, and the third phase.

Example 19. The method of one of examples 15 to 18, wherein the first phase includes a sequence of source pulses at the first source power level.

Example 20. An apparatus configured to perform the method of one of examples 15 to 19, the apparatus including: a coupling element disposed adjacent to the plasma processing chamber; a substrate holder supporting the substrate; a source power supply node coupled to the coupling element and configured to apply the source power pulse; and a bias power supply node coupled to the substrate holder and configured to apply the bias power pulse.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, one or more of the embodiments of FIGS. 2-4 may be combined in further embodiments. Similarly, embodiments described with respect to FIG. 7 may be combined with FIG. 8. It is therefore intended that the appended claims encompass any such modifications or embodiments.

What is claimed is:

1. A method of plasma processing, the method comprising:
performing a reactive species control phase comprising pulsing source power at a first source power level to a processing chamber for a first duration between about 10 µs and about 100 µs to generate ions and radicals in a plasma;
performing a power off phase immediately after the reactive species control phase, the power off phase comprising reducing the source power to the processing chamber to zero and providing no bias power to the processing chamber for a power off duration greater than zero;
performing an ion/radical control phase immediately following the power off phase, the ion/radical control phase comprising simultaneously pulsing source power to the processing chamber at a second source power level greater than zero and less than the first source power level, and pulsing bias power to a substrate in the processing chamber for a second duration between about 20 µs and about 100 µs; and
performing a by-product control phase after the ion/radical control phase, the by-product control phase comprising reducing the source power to the processing chamber and the bias power to the substrate to zero for a third duration greater than both the first duration and the second duration and between about 100 µs and about 3 ms.

2. The method of claim 1, further comprising:
cyclically performing the reactive species control phase, the power off phase, the ion/radical control phase, and the by-product control phase.

3. The method of claim 1, further comprising:
providing a gas to the processing chamber, wherein a flowrate of the gas is constant during the reactive species control phase, the ion/radical control phase, and the by-product control phase.

4. The method of claim 1, wherein:
the reactive species control phase further comprises pulsing the bias power to the substrate.

5. The method of claim 1, wherein the by-product control phase further comprises:
pulsing the bias power to the substrate to control redeposition of by-products at the substrate.

6. The method of claim 1, wherein:
the first duration is about 20 µs;
the second duration is about 70 µs; and
the third duration is about 1 ms.

7. A method of plasma processing, the method comprising:
processing a substrate using a cycle of power pulses during which source power pulses are applied to a coupling element and bias power pulses are applied to a substrate holder supporting the substrate;
wherein the cycle of power pulses consists of
a first phase defined by a single first source power pulse having a first source power level and coextensive with a single first bias power pulse having a first bias power level,
a second phase defined by a single second source power pulse having a second source power level and coextensive with a single second bias power pulse having a second bias power level, and
a third phase defined by a single third source power level coextensive with a third bias power level;
wherein the first bias power level is greater than or equal to zero;
wherein the second source power level is less than the first source power level;
wherein the second bias power level is greater than the second source power level;
wherein the third source power level is less than the first source power level; and
wherein the third bias power level is less than the second bias power level.

8. The method of claim 7, further comprising repeatedly performing the cycle of power pulses.

9. The method of claim 7, wherein the first bias power level is zero.

10. The method of claim 7, wherein the first bias power level is greater than zero.

11. The method of claim 7, wherein the third bias power level is greater than zero.

12. The method of claim 7, wherein both the third source power level and the third bias power level are zero.

13. A method of plasma processing, the method comprising processing a substrate in a plasma processing chamber by repeating a cycle of sequential phases comprising a first phase, a second phase, and a third phase, the cycle comprising:
applying a first source power pulse coextensively with a first bias power pulse to the plasma processing chamber during the first phase consisting of the coextensive first source power pulse and first bias power pulse, wherein
the first source power pulse has a first source power level greater than zero, and
the first bias power pulse has a first bias power level greater than zero;
applying a second source power pulse to the plasma processing chamber coextensively with a second bias power pulse to the substrate in the plasma processing chamber during the second phase consisting of the coextensive second source power pulse and second bias power pulse, wherein
- the second source power pulse has a second source power level less than the first source power level, and
- the second bias power pulse has a second bias power level greater than the second source power level and the first bias power level; and reducing a quantity of by-products in the plasma processing chamber during the third phase consisting of a third source power level less than the first source power level and coextensive with a third bias power level equal to zero.

14. The method of claim 13, further comprising:
providing a gas into the plasma processing chamber at a gas flowrate, wherein the gas flowrate is maintained at a constant value during the first phase, the second phase, and the third phase.

15. The method of claim 13, wherein the first phase comprises a sequence of source pulses at the first source power level.

16. The method of claim 13, further comprising:
reducing both the source power and the bias power to the plasma processing chamber to zero for a duration greater than zero between the first phase and the second phase.

17. The method of claim 13, wherein:
- the duration of the first phase is between about 10 µs and about 100 µs;
- the duration of the second phase is between about 20 µs and about 100 µs; and
- the duration of the third phase is between about 100 µs and about 3 ms.

* * * * *